(12) United States Patent
Nutz et al.

(10) Patent No.: US 8,025,985 B2
(45) Date of Patent: Sep. 27, 2011

(54) POROUS METALLIZED SHEETS COATED WITH AN INORGANIC LAYER HAVING LOW EMISSIVITY AND HIGH MOISTURE VAPOR PERMEABILITY

(75) Inventors: Michel Nutz, Escherange (FR); Aloyse Nicolas Wilmes, Gonderange (LU)

(73) Assignee: E. I. du Pont de Nemours and Company, Wilmington, DE (US)

( * ) Notice: Subject to any disclaimer, the term of this patent is extended or adjusted under 35 U.S.C. 154(b) by 307 days.

(21) Appl. No.: 11/201,787

(22) Filed: Aug. 11, 2005

(65) Prior Publication Data

US 2007/0037465 A1 Feb. 15, 2007

(51) Int. Cl.
*B32B 27/12* (2006.01)
*B32B 15/14* (2006.01)
*B32B 15/08* (2006.01)
*B32B 9/00* (2006.01)
*B32B 27/32* (2006.01)
*B32B 27/00* (2006.01)

(52) U.S. Cl. ........ 428/689; 442/131; 442/376; 428/220; 428/423.1; 428/425.5; 428/425.8; 428/688

(58) Field of Classification Search .................. 442/131, 442/132, 340, 376, 379, 71–76, 85
See application file for complete search history.

(56) References Cited

U.S. PATENT DOCUMENTS

| | | | |
|---|---|---|---|
| 3,081,519 A | 3/1963 | Blades et al. | |
| 3,169,899 A | 2/1965 | Steuber | |
| 3,227,784 A | 1/1966 | Blades et al. | |
| 3,307,964 A | 3/1967 | Jacobson | |
| 3,660,138 A * | 5/1972 | Gorrell | 442/230 |
| 3,851,023 A | 11/1974 | Brethauer et al. | |
| 4,739,012 A | 4/1988 | Hagman | |
| 4,868,062 A | 9/1989 | Hoeschele et al. | |
| 4,974,382 A | 12/1990 | Avellanet | |
| 4,999,222 A | 3/1991 | Jones et al. | |
| 5,122,412 A * | 6/1992 | Jones et al. | 442/376 |
| 5,436,035 A | 7/1995 | Lohwasser | |
| 5,580,386 A | 12/1996 | Lohwasser | |
| 5,955,175 A | 9/1999 | Culler | |
| 6,030,671 A * | 2/2000 | Yang et al. | 428/34 |
| 6,066,826 A | 5/2000 | Yializis | |
| 6,083,628 A | 7/2000 | Yializis | |
| 6,355,333 B1 * | 3/2002 | Waggoner et al. | 428/174 |
| 6,749,940 B1 * | 6/2004 | Terasaki et al. | 428/425.8 |
| 2003/0136078 A1 | 7/2003 | Brown et al. | |
| 2004/0146660 A1 | 7/2004 | Goodwin et al. | |
| 2004/0213918 A1 | 10/2004 | Mikhael et al. | |
| 2006/0040091 A1 * | 2/2006 | Bletsos et al. | 428/137 |
| 2006/0257585 A1 | 11/2006 | Schiller et al. | |

FOREIGN PATENT DOCUMENTS

EP 0 495 143 A2 7/1992
(Continued)

OTHER PUBLICATIONS

U.S. Appl. No. 10/924,218, filed Aug. 23, 2004, Bletsos et al.

(Continued)

*Primary Examiner* — Angela Ortiz
*Assistant Examiner* — Jennifer Steele

(57) ABSTRACT

A metallized composite sheet having low emissivity formed by coating a metallized moisture vapor permeable sheet with at least one outer inorganic coating layer, wherein the moisture vapor permeability of the composite sheet is at least about 80% of the moisture vapor permeability of the starting sheet.

24 Claims, 2 Drawing Sheets

FOREIGN PATENT DOCUMENTS

| | | |
|---|---|---|
| EP | 1 400 348 A2 | 3/2004 |
| GB | 2318127 A | 4/1998 |
| JP | 06-251632 | 9/1994 |
| JP | 2001015378 A * | 1/2001 |
| JP | 2001-315251 | 11/2001 |
| JP | 2004-330669 | 11/2004 |
| WO | WO 99/58757 | 11/1999 |
| WO | WO 99/59185 | 11/1999 |
| WO | WO 01/28770 A1 | 4/2001 |
| WO | WO 03/086031 A1 | 10/2003 |
| WO | WO 2004/050945 A2 | 6/2004 |

OTHER PUBLICATIONS

Dennier et al., Growth Modes of SiO2 Films on Polymeric Substrates, 45th Annual Technical Conference Proceedings of the Society Vacuum Coaters (SVC) (2002), p. 465

Lobig et al., "Treatmag, a New Tool for Inline Plasma Pretreatment in Web Coaters for Packaging Applications", 1998.

Matteuchi, "Electron Beam Evaporation and DC-Magnetron Sputtering in Roll Coating", 30th Annual Technical Conference of the SVC (1987), p. 91.

Kuznetsov, "Electron Beam Evaporation Process in the Soviet Union", Annual Conference Proceedings of the SVC (1978), p. 12.

Hoffman et al., 42nd Annual Technical Conference Proceedings of the SVC (1999), p. 425.

Sherman, "Plasma-Enhanced Chemical Vapor Deposition", Handbook of Deposition Technologies for Films and Coatings—Science, Technology and Applications (2nd Edition), 1994, Chapter 8, pp. 460-484, Bunshah, R.F. (ed.), William Andrew Publishing/Noyes.

Casey et al., "Clear Barrier Coatings", 42nd Annual Technical Conference Proceedings of the SVC (1999) (p. 425).

* cited by examiner

POROUS METALLIZED SHEETS COATED WITH AN INORGANIC LAYER HAVING LOW EMISSIVITY AND HIGH MOISTURE VAPOR PERMEABILITY

BACKGROUND OF THE INVENTION

1. Field of the Invention

The present invention relates to metallized moisture vapor permeable sheets having an inorganic surface layer to prevent corrosion of the metal layer.

2. Description of the Related Art

It is known in the art to use moisture vapor permeable (breathable) metallized sheets as house wrap in building construction. The metallized sheets allow moisture vapor to pass through the sheet, thus preventing moisture condensation in insulation that is installed behind the sheet, while at the same time providing a barrier to air and liquid water and enhancing the energy efficiency of the building. U.S. Pat. No. 4,999,222 to Jones et al. describes moisture vapor permeable metallized polyethylene sheets with low emissivity prepared by calendering a plexifilamentary film-fibril sheet followed by vacuum metallization. U.S. Pat. No. 4,974,382 to Avellanet describes an infiltration and energy barrier that can be vapor permeable or impermeable having at least one metallized layer thereon. Published PCT International Application No. WO 01/28770 to Squires et al. describes breathable building membranes that include an under layer of microporous film and a top layer formed of a filamentous polymeric fabric, for example a spunbond fabric, which is provided with a moisture vapor permeable reflective metal coating. While the breathable metallized sheets described above provide a thermal barrier by reflecting infrared radiation, they are susceptible to oxidation of the metal layer upon exposure to air and moisture. An oxidized metal layer generally has a higher emissivity than the corresponding metal and is less effective as a thermal barrier. In addition, a thin exposed metal layer can be damaged during processing, installation, etc.

Published European Patent Application No. EP 1400348 to Avril et al. describes liquid impermeable, moisture vapor/gas permeable laminated fabrics that are suitable for use as construction fabrics such as house wrap and roofing underlay that include a reflective film layer formed by vapor depositing a metal layer on a first polymeric film layer and sandwiching the metal layer between the first polymeric film layer and a second polymeric film layer. The film layers protect the metal layer from damage during use, but are moisture impermeable and are microperforated after metallization to provide the desired moisture vapor permeability.

Metallized nonwovens that have been coated with an organic polymer are also known for construction end uses, such as house wrap. However, the polymeric coating is applied using methods that significantly reduce the moisture vapor permeability compared to the uncoated metallized nonwoven sheet. U.S. Patent Application Publication No. 2003/0136078 to Brown et al. describes a method of insulating a building that includes the step of introducing an insulating membrane comprising a reflective layer and a breathable textile layer into the cavity between the outer cladding layer and the frame. The metallized layer may optionally be coated with a protective layer of plastic or varnish to protect the metal surface.

When a moisture vapor permeable sheet is coated over substantially an entire surface using conventional methods such as air knife coating, flexographic printing, gravure coating, etc., the coating reduces the moisture vapor permeability of the sheet. If the starting sheet has an open structure and is highly air permeable, the sheet can retain sufficient moisture vapor permeability after coating to be useful in certain end uses, such as apparel. For example, fabrics described in U.S. Pat. No. 5,955,175 to Culler are both air permeable and moisture vapor permeable after being metallized and coated with an oleophobic coating. However, when the starting moisture vapor permeable sheet has a highly closed structure with very low air permeability, such as nonwoven and other sheets used as house wrap or roof lining in the construction industry, conventional coatings result in significant covering of the pores on the surface of the sheet. This results in a coated sheet having significantly lower moisture vapor permeability than the starting sheet. This is undesirable in house wrap and roof lining products, which are desirably permeable to moisture vapor while at the same time forming a barrier to infiltration by air and liquid water. This process also results in a coated sheet with a substantially higher emissivity than the uncoated metal layer.

US Patent Application Publication US 2004/0213918 A1 (Mikhael et al.) discloses a process for functionalizing a porous substrate, such as a nonwoven fabric or paper, with a layer of polymer, and optionally a layer of metal or ceramic. According to one embodiment, the process includes the steps of flash evaporating a monomer having a desired functionality in a vacuum chamber to produce a vapor, condensing the vapor on the porous substrate to produce a film of the monomer on the porous substrate, curing the film to produce a functionalized polymeric layer on the porous substrate, vacuum depositing an inorganic layer over the polymer layer, and flash evaporating and condensing a second film of monomer on the inorganic layer and curing the second film to produce a second polymeric layer on the inorganic layer. Mikhael et al. also discloses another embodiment including the steps of flash evaporating and condensing a first film of monomer on the porous substrate to produce a first film of the monomer on the porous substrate, curing the film to produce a functionalized polymeric layer on the porous substrate, vacuum depositing a metal layer over the polymer layer, and flash evaporating and condensing a second film of monomer on the metal layer and curing the second film to produce a second polymeric layer on the metal layer.

It would be desirable to provide metallized sheets that have good protection against oxidation while not sacrificing high moisture vapor permeability and good thermal barrier properties for construction uses such as house wrap and roof lining, and other uses requiring good thermal barrier properties such as clothing and tents.

BRIEF SUMMARY OF THE INVENTION

In one embodiment, the present invention is directed to a moisture vapor permeable flexible multilayer composite comprising a moisture vapor permeable sheet and a metal layer adjacent a first outer surface of the moisture vapor permeable substrate and an outer coating layer of inorganic material deposited on the metal layer such that the metal layer is substantially free from oxidation and the emissivity of the multilayer composite is less than about 0.2.

Another embodiment of the present invention is directed to a process for coating a moisture vapor permeable sheet having a metal layer to protect the metal layer from corrosion while retaining low emissivity and a high moisture vapor transmission rate.

DETAILED DESCRIPTION OF THE INVENTION

Figure 1:
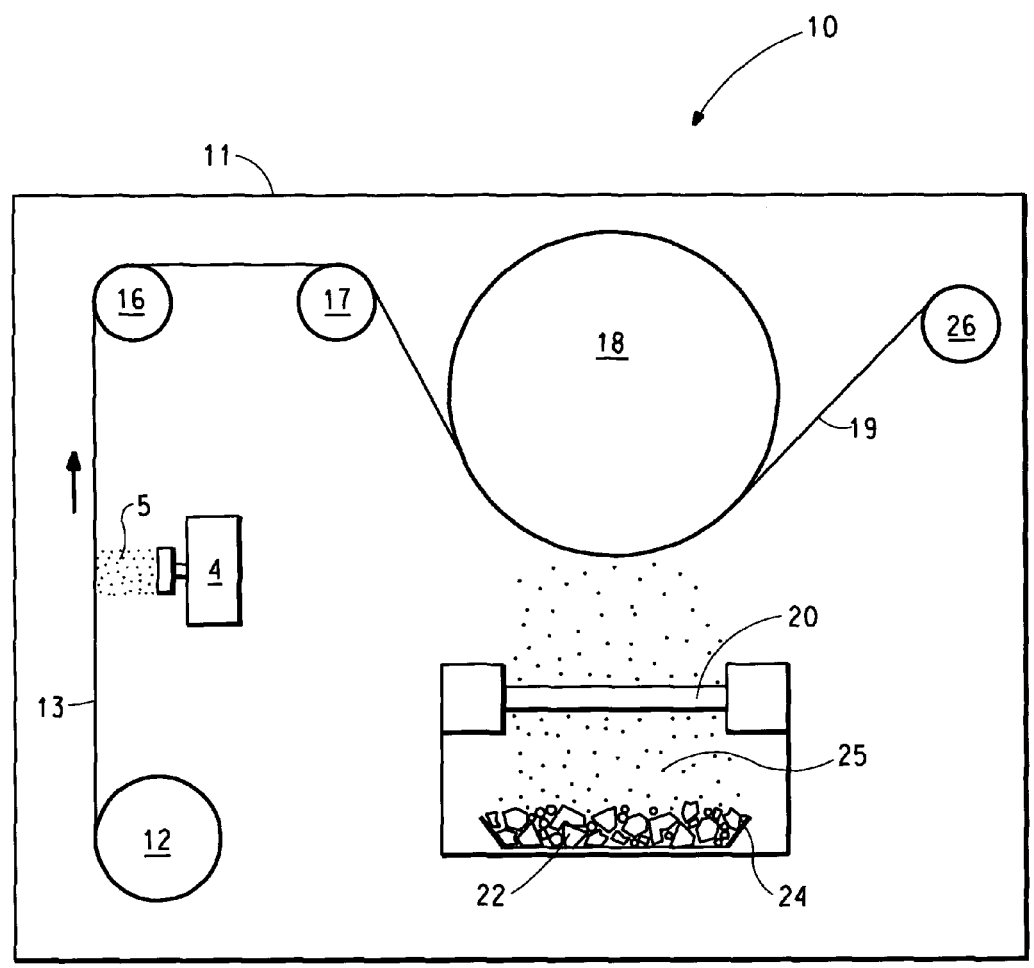
FIG. 1 is a schematic diagram of a type of apparatus suitable for forming a composite sheet of the present invention.

The terms "nonwoven fabric", "nonwoven sheet", "nonwoven layer", and "nonwoven web" as used herein refer to a structure of individual strands (e.g. fibers, filaments, or threads) that are positioned in a random manner to form a planar material without an identifiable pattern, as opposed to a knitted or woven fabric. The term "fiber" is used herein to include staple fibers as well as continuous filaments. Examples of nonwoven fabrics include meltblown webs, spunbond nonwoven webs, flash spun webs, staple-based webs including carded and air-laid webs, spunlaced webs, and composite sheets comprising more than one nonwoven web.

The term "woven sheet" is used herein to refer to sheet structures formed by weaving a pattern of intersecting warp and weft strands.

The term "spunbond fibers" as used herein means fibers that are melt-spun by extruding molten thermoplastic polymer material as fibers from a plurality of fine, usually circular, capillaries of a spinneret with the diameter of the extruded fibers then being rapidly reduced by drawing and then quenching the fibers.

The term "meltblown fibers" as used herein, means fibers that are melt-spun by meltblowing, which comprises extruding a melt-processable polymer through a plurality of capillaries as molten streams into a high velocity gas (e.g. air) stream.

The term "spunbond-meltblown-spunbond nonwoven fabric" ("SMS") as used herein refers to a multi-layer composite sheet comprising a web of meltblown fibers sandwiched between and bonded to two spunbond layers. Additional spunbond and/or meltblown layers can be incorporated in the composite sheet, for example spunbond-meltblown-meltblown-spunbond webs ("SMMS"), etc.

The term "plexifilamentary" as used herein, means a three-dimensional integral network or web of a multitude of thin, ribbon-like, film-fibril elements of random length and with a mean film thickness of less than about 4 microns and a median fibril width of less than about 25 microns. In plexifilamentary structures, the film-fibril elements are generally coextensively aligned with the longitudinal axis of the structure and they intermittently unite and separate at irregular intervals in various places throughout the length, width, and thickness of the structure to form a continuous three-dimensional network. A nonwoven web of plexifilamentary film-fibril elements is referred to herein as a "flash spun plexifilamentary sheet."

As used herein, the term "tape" refers to a flattened strand, such as flattened strands formed from a slit film.

As used herein, the term "metal" includes metal alloys as well as metals.

In one embodiment, the present invention relates to metallized moisture vapor permeable composite sheets formed by coating at least one side of a moisture vapor permeable sheet layer with at least one metal layer and a thin inorganic coating layer on the side of the metal layer opposite the sheet layer. Surprisingly, the inorganic coating layer does not negatively impact the emissivity or the moisture vapor transmission rate of the metallized moisture vapor permeable sheet layer. Also surprisingly, a very thin coating is sufficient to protect the metal layer from corrosion. The coatings are preferably formed under vacuum using vapor deposition techniques under conditions that substantially coat the sheet layer without significantly reducing its moisture vapor permeability. The composite sheets have high moisture vapor permeability and good thermal barrier properties. The composite sheets can also be selected to provide a high barrier to intrusion by liquid water (high hydrostatic head), which is also important in construction end uses such as house wrap and roof lining. The balance of properties provided by the composite sheets of the present invention is superior to currently available metallized sheets used in the construction industry. The composite sheets of the present invention provide thin, strong, moisture vapor permeable air, and thermal barriers that are suitable for use in existing or new construction. The composite sheets of the present invention, when used as a thermal barrier in wall and/or roof systems as described in pending U.S. patent application Ser. No. 10/924,218, are beneficial in meeting building regulations requiring higher energy efficiency for new construction and renovated buildings. U.S. patent application Ser. No. 10/924,218 is also assigned to E. I. du Pont de Nemours and Company, Wilmington, Del. (hereafter DuPont).

The composite sheets of the present invention can also be used as thermal barriers in items requiring high-energy efficiency, such as articles of clothing, tents, and sleeping bags, etc.

The composite sheets of the present invention include the following structures: Sheet/M/IL, Sheet/L1/M/IL, and Sheet/L1/M/L2/M/IL, etc., where Sheet is a moisture vapor permeable sheet layer, M is a low emissivity metal layer, IL is the inorganic outer layer and L1 and L2 are organic or inorganic coating layers, (the organic coating layers comprising an organic polymer or organic oligomer, or blends thereof). The abbreviation "L1" is used herein to refer to an optional intermediate organic or inorganic coating layer that is deposited on a surface of the sheet layer prior to depositing a metal layer thereon. The intermediate coating layer is believed to improve the thermal barrier properties of the composite sheet compared to composite sheets that do not include an intermediate coating layer. The composite sheets include an outer, inorganic coating layer overlying the metal layer designated as "IL" in the above-described structures. The sheet layer can be coated on one side, as in the structures described above, or on both sides such as in the following structures: IL/M/SheetM/IL, IL/M/L1/Sheet/L1/M/IL, etc. In composite sheet structures having more than one metal layer, individual metal layers can be formed from the same or different metal and can have the same or different thickness. Similarly, in structures having more than one inorganic and/or organic coating layer, the individual coating layers can have the same or different composition and/or thickness. Each metal layer can comprise more than one adjacent metal layers wherein the adjacent metal layers can be the same or different. Similarly, each inorganic and/or organic layer can comprise more than one adjacent layer, wherein the adjacent layers can be the same or different.

In one embodiment of the present invention, one or both sides of the moisture vapor permeable sheet layer comprise a porous outer surface, such as a fibrous surface or a porous film that is coated with the inorganic and metal layers. The organic or inorganic and metal layers are deposited on the porous surface such that only the exposed or "outer" surfaces of the fibers or film on the coated side(s) are coated, without covering the pores.

Moisture vapor permeable sheet layers suitable for forming the composite sheets of the present invention can have a relatively low air permeability, such as between about 5 and about 12,000 Gurley seconds, even between about 20 and about 12,000 Gurley seconds, even between about 100 and about 12,000 Gurley seconds, and even between about 400 and about 12,000 Gurley seconds, which is generally considered to provide a barrier to air infiltration. Alternately, the moisture vapor permeable sheet layer can be selected to have a relatively high air permeability, for example those sheets having a Gurley Hill air permeability of less than 5 seconds, with the air permeability falling in the Frazier air permeability range. A composite sheet with a relatively high air permeability can have a moisture vapor permeability (also referred to as "moisture vapor transmission rate" or MVTR) of at least about 35 $g/m^2/24$ hours, even at least about 200 $g/m^2/24$ hours, even at least about 600 $g/m^2/24$ hours, even greater than about 1000 $g/m^2/24$ hours and a hydrostatic head of at least about 20 cm $H_2O$, even at least about 50 cm $H_2O$, even at least about 100 cm $H_2O$, and even at least about 130 cm $H_2O$. When used as a house wrap, the composite sheet preferably has a tensile strength of at least about 35 N/cm.

The moisture vapor permeable sheet layers can be any flexible sheet that allows moisture vapor to pass through. Suitable moisture vapor permeable sheet layers are porous sheets, which include woven fabrics, such as sheets of woven fibers or tapes; or nonwoven fabrics, such as flash-spun plexifilamentary sheets, spunbond nonwoven sheets, spunbond-meltblown nonwoven sheets, spunbond-meltblown-spunbond nonwoven sheets; or moisture vapor permeable films such as microporous films, microperforated films or moisture vapor permeable monolithic films; or paper or laminates that include a nonwoven or woven fabric or scrim layer and a moisture vapor permeable film layer, such as a microporous film, a microperforated film, or a moisture vapor permeable monolithic film. The starting sheet layer can comprise a moisture vapor permeable sheet that has been coated using conventional coating methods. For example, sheets currently used in the construction industry include sheets of woven tapes that have been coated with a polymeric film layer and microperforated. The sheet layer may be formed from a variety of polymeric compositions. For example, sheets used in the construction industry are typically formed from polyolefins such as polypropylene or high-density polyethylene, polyesters, or polyamides. The moisture vapor permeable sheet layer typically has a basis weight of between about 10 $g/m^2$ and about 100 $g/m^2$ or between about 40 $g/m^2$ and about 100 $g/m^2$. However, the moisture vapor permeable layer can be a laminate structure, for example, TYVEK® SUPRO, which is a laminate of a flash-spun plexifilamentary sheet of polyethylene with a basis weight of about 60 $g/m^2$ and a sheet of spunbond polypropylene with a basis weight of about 70 $g/m^2$, available from E. I. du Pont de Nemours and Company, Wilmington, Del. (hereafter, DuPont). Suitable laminates, including an adhesive, can have a basis weight of between about 140 $g/m^2$ and about 300 $g/m^2$.

In one embodiment, the moisture vapor permeable sheet is a flash spun plexifilamentary polyolefin sheet such as Tyvek® flash spun high-density polyethylene, available from DuPont. Suitable flash spun plexifilamentary film-fibril materials may also be made from polypropylene. The moisture vapor permeable sheet can be a laminate of a flash spun plexifilamentary sheet with one or more additional layers, such as a laminate comprising a flash spun plexifilamentary sheet and a melt-spun spunbond sheet. Flash spinning processes for forming web layers of plexifilamentary film-fibril strand material are disclosed in U.S. Pat. No. 3,081,519 (Blades et al.), U.S. Pat. No. 3,169,899 (Steuber), U.S. Pat. No. 3,227,784 (Blades et al.), U.S. Pat. No. 3,851,023 (Brethauer et al.), the contents of which are hereby incorporated by reference.

The moisture vapor permeable can be a commercially available house wrap or roof lining product. Flash-spun plexifilamentary sheets of polyethylene used in building construction include Tyvek® SUPRO roof lining, Tyvek® HomeWrap®, and Tyvek® CommercialWrap®. Tyvek® HomeWrap® and CommercialWrap® are registered trademarks of DuPont. Other house wrap products suitable as the moisture vapor permeable sheet layer include Air-Guard® Buildingwrap (manufactured by Fabrene, Inc., North Bay, Ontario) which is a woven fabric of high density polyethylene slit film that is coated with white pigmented polyethylene on one side and perforated, Pinkwrap® Housewrap (manufactured by Owens Corning, Toledo, Ohio) which is a woven fabric of polypropylene slit film that is coated on one side and perforated, Pinkwrap Plus® Housewrap (manufactured by Owens Corning, Toledo, Ohio) which is a cross-ply laminated polyolefin film that is micropunctured and has a corrugated surface, Tuff Wrap® Housewrap (manufactured by Cellotex Corporation, Tampa, Fla.) which is a woven fabric of high density polyethylene film that is coated on one side and perforated, Tuff Weather Wrap® (manufactured by Cellotex Corporation, Tampa, Fla.) which is a polyolefin sheet bonded to a nonwoven scrim that has been embossed to create small dimples on the surface, Greenguard Ultra Amowrap® (manufactured by Amoco, Smyrna, Ga.) which is a woven fabric of polypropylene slit film that is coated on one side and perforated, Weathermate® Plus Housewrap (manufactured by Dow Chemical Company, Midland, Mich.) which is a non-perforated nonwoven membrane that has been coated with a clear coating, and Typar® Housewrap (manufactured by Reemay, Old Hickory, Tenn.) which is a coated spunbond polypropylene sheet.

In some cases it may be desirable to use a moisture vapor permeable sheet layer that is substantially air impermeable. For example, the moisture vapor permeable sheet layer can comprise a laminate of a nonwoven or woven fabric or scrim and a moisture vapor permeable film layer, wherein the moisture vapor permeable film layer is a microporous film or a monolithic film. Generally, one or more moisture vapor permeable film layers are sandwiched between outer nonwoven or woven fabric or scrim layers and the metal and inorganic coating layers are deposited on at least one of the outer layers such that an outer inorganic coating layer forms an outside surface of the composite sheet. In one such embodiment, a moisture vapor permeable film layer is sandwiched between two staple fiber nonwoven layers, or two continuous filament nonwoven layers, or two woven fabrics. The outer fabric or scrim layers can be the same or different.

Moisture vapor permeable monolithic (non-porous) films are formed from a polymeric material that can be extruded as a thin, continuous, moisture vapor permeable, and substantially liquid impermeable film. The film layer can be extruded directly onto a first nonwoven or woven substrate layer using conventional extrusion coating methods. Preferably, the monolithic film is no greater than about 3 mils (76 micrometers) thick, even no greater than about 1 mil (25 micrometers) thick, even no greater than about 0.75 mil (19 micrometers) thick, and even no greater than about 0.60 mil (15.2 micrometers) thick. In an extrusion coating process, the extruded layer and substrate layer are generally passed through a nip formed between two rolls (heated or unheated), generally before complete solidification of the film layer, in order to improve the bonding between the layers. A second nonwoven or woven substrate layer can be introduced into the nip on the side of the film opposite the first substrate to form a moisture vapor permeable, substantially air impermeable laminate wherein the monolithic film is sandwiched between the two substrate layers.

Polymeric materials suitable for forming moisture vapor permeable monolithic films include block polyether copolymers such as a block polyether ester copolymers, polyetheramide copolymers, polyurethane copolymers, poly(etherimide) ester copolymers, polyvinyl alcohols, or a combination thereof. Preferred copolyether ester block copolymers are segmented elastomers having soft polyether segments and hard polyester segments, as disclosed in Hagman, U.S. Pat. No. 4,739,012 that is hereby incorporated by reference. Suitable copolyether ester block copolymers include Hytrel® copolyether ester block copolymers sold by DuPont, and Arnitel® polyether-ester copolymers manufactured by DSM Engineering Plastics, (Heerlen, Netherlands). Suitable copolyether amide polymers are copolyamides available under the name Pebax® from Atochem Inc. of Glen Rock, N.J., USA. Pebax® is a registered trademark of Arkema of Paris, France. Suitable polyurethanes are thermoplastic urethanes available under the name Estane® from The B. F. Goodrich Company of Cleveland, Ohio, USA. Suitable copoly(etherimide) esters are described in Hoeschele et al., U.S. Pat. No. 4,868,062. The monolithic film layer can be comprised of multiple layers of moisture vapor permeable film layers. Such a film may be co-extruded with layers comprised of one or more of the above-described breathable thermoplastic film materials.

Microporous films are well known in the art, such as those formed from a mixture of a polyolefin (e.g. polyethylene) and fine particulate fillers, which is melt-extruded, cast or blown into a thin film and stretched, either mono- or bi-axially to form irregularly shaped micropores that extend continuously from the top to the bottom surface of the film. U.S. Pat. No. 5,955,175 discloses microporous films, which have nominal pore sizes of about 0.2 micrometer. Microporous films can be laminated between nonwoven or woven layers using methods known in the art such as thermal or adhesive lamination.

Microperforated films are formed by casting or blowing a polymer into a film, followed by mechanically perforating the film, as generally disclosed in European Patent Publication No. EP 1 400 348 A2, which indicates that the microperforations are typically on the order of 0.1 mm to 1.0 mm in diameter.

According to the present invention, the metal and inorganic coating layers are deposited on a moisture vapor permeable sheet using methods that do not substantially reduce the moisture vapor permeability of the sheet. The coatings are deposited over substantially the entire surface of the sheet material while leaving the pore openings of the material substantially uncovered. According to one embodiment of the invention, the moisture vapor permeable sheet layer comprises a fibrous nonwoven or woven fabric. Alternately, the moisture vapor permeable sheet layer can be a fabric-film laminate wherein the fabric comprises an outer surface of the laminate, or the outer surface of the laminate can be a microperforated film. The metal and inorganic (and optional organic) coating layers are deposited on the fabric or microperforated film such that, in the case of a fabric, the exposed surfaces of individual fabric strands on the coated surface of the composite sheet are substantially covered while leaving the interstitial spaces or pores between the strands substantially uncovered by the coating material. By "substantially uncovered" is meant that at least 35% of the interstitial spaces between the fibers are free of coating. In one embodiment, the total combined thickness of the organic coating layers is less than the diameter of the fibers of the nonwoven web. For non-fibrous sheets, at least 35% of the surface pores on the sheet surface are substantially uncovered. This provides a coated composite sheet that has a moisture vapor permeability that is reduced by no more than 20%, even no more than 15%, even no more than 5%, as compared with the starting sheet material. Conversely stated, this provides a coated composite sheet that has a moisture vapor permeability that is at least about 80%, even at least about 85%, and even at least about 95% of the moisture vapor permeability of the starting sheet material.

Since the coatings are discontinuous over the pores, the moisture vapor permeability of the composite sheets of the invention is not impacted significantly. Vacuum vapor deposition methods known in the art are preferred for depositing the metal and inorganic (or inorganic and organic) coatings. The thickness of the metal and inorganic (or inorganic and organic) coatings are preferably controlled within ranges that provide a composite sheet having an emissivity no greater about 0.2, even no greater than about 0.15, even no greater than about 0.12, and even no greater than about 0.10.

The thickness and the composition of the inorganic coating layer is selected such that, in addition to not substantially changing the moisture vapor permeability of the sheet layer, it does not significantly increase the emissivity of the metallized substrate. The inorganic coating layer can have a thickness between about 25 and 500 nanometers (nm), which corresponds to between about 0.06 g/m$^2$ and 1.2 g/m$^2$ of the inorganic coating material. The inorganic coating layer preferably has a thickness between about 60 nm and 300 nm. If the inorganic coating layer is too thin, it may not protect the metal layer from oxidation, resulting in an increase over time in emissivity of the composite sheet. If the inorganic coating layer is too thick, the MVTR of the composite sheet can decrease and its emissivity can increase, resulting in lower thermal barrier properties.

It may be desirable in some cases for the intermediate organic coating layer to be very thin, for example between about 0.02 and 0.2 micrometer (corresponding to approximately 0.015 g/m$^2$ to 0.15 g/m$^2$). One such example is when the sheet layer comprises a flash spun plexifilamentary or other nonwoven sheet wherein the plexifilaments or fibers have features on their surface that are on the order of 500 nm or less. This is much finer than the surface "macro-roughness" of the nonwoven sheet, where the macro-roughness features are caused by the fibers themselves (peaks and valleys) and gaps between the fibers. It is important that the macro-roughness of the sheet is not significantly altered by metallization and coating, because doing so results in reducing or blocking of the interstitial spaces between the fibers and a reduction in the moisture vapor permeability of the sheet. A very thin polymer layer will smooth the micro-roughness that exists on the surface of the individual fibers without impacting the macro-roughness of the fibrous sheet. In the case of flash spun polyethylene, the coating layer would need to be at least as thick as the lamellar crystallites of polyethylene, which are approximately 25 nm thick. This smoothing effect may result in a smoother metal layer on the individual fiber surfaces, thereby reducing the emissivity of the composite sheet compared to sheets that do not include L1. For example, an intermediate coating layer L1 having a thickness between about 0.025 and 0.2 micrometer is suitable for flash spun polyethylene sheets.

Suitable compositions for the intermediate organic coating layer(s) include polyacrylate polymers and oligomers, as described in U.S. patent application Ser. No. 10/924,218.

Metals suitable for forming the metal layer(s) of the composite sheets of the present invention include aluminum, gold, silver, zinc, tin, lead, copper, and their alloys or other metals and their alloys so long as the desired low emissivity is obtained. It is also desirable that the metals are capable of being evaporated or are otherwise suitable for being deposited as thin layers on the sheet. The metal alloys can include other metals, so long as the alloy composition provides a low emissivity composite sheet. Each metal layer has a thickness between about 15 nm and 200 nm, or between about 30 nm and 60 nm. In one embodiment, the metal layer comprises aluminum having a thickness between about 15 and 150 nm, or between about 30 and 60 nm. Methods for forming the metal layer are known in the art and include resistive evaporation, electron beam metal vapor deposition, or sputtering. If the metal layer is too thin, the desired thermal barrier properties will not be achieved. If the metal layer is too thick, it can crack and flake off. Generally, it is preferred to use the lowest metal thickness that will provide the desired thermal barrier properties. When the composite sheet of the present invention is used as a house wrap or roof lining, the metal layer reflects infrared radiation or emits little infrared radiation, providing a thermal barrier that reduces energy loss and keeps the building cooler in the summer and warmer in the winter.

The thermal barrier properties of a material can be characterized by its emissivity. Emissivity is the ratio of the power per unit area radiated by a surface to that radiated by a black body at the same temperature. A black body therefore has an emissivity of one and a perfect reflector has an emissivity of zero. The lower the emissivity, the higher the thermal barrier properties. The inorganic coating layer also protects the metal from mechanical abrasion during roll handling, transportation and end-use installation.

The metallized flexible porous substrate can be coated with a layer of inorganic material by any of several known deposition processes. The deposition process can be carried out in a vacuum chamber, as in physical vapor deposition (PVD) including deposition processes employing thermal evaporation, electron beam evaporation and sputtering, chemical vapor deposition (CVD) or plasma-enhanced chemical vapor deposition (PECVD). The deposition process can also be carried out under atmospheric conditions, e.g., atmospheric pressure glow discharge (APG) or atmospheric pressure plasma-enhanced chemical vapor deposition (AP-PECVD).

Physical vapor deposition processes include evaporation processes in which a compound to be applied to the surface of a substrate is evaporated within a vacuum chamber and condensed onto the substrate passing over a cooling drum, and sputtering which is also a vacuum process in which fast ions strike the surface of a material and eject atoms of that material by a momentum transfer process. As with evaporation, the ejected molecules are condensed on the substrate to form a surface coating.

PVD processes utilizing evaporation have been found to be suitable for use in the present invention. Evaporation is usually carried out in vacuum at typically less than about $5\times10^{-4}$ millibar ($5\times10^{-5}$ kPa) so that the evaporated atoms undergo an essentially collisionless line-of-sight transport prior to condensation on the substrate. In the evaporation process, the vapors are produced from a material located in a source which can be heated by different ways, e.g. by resistance heating or by electron beam. In resistance heating, the inorganic compound to be applied to the surface of the porous substrate can be evaporated by resistance heating within a vacuum chamber. The inorganic material to be deposited is heated until sublimation by means of an electrical current passing through a graphite electrode located very close to the inorganic material or through a tantalum boat containing the inorganic material. The evaporated material is then condensed on the substrate. As an example, the evaporation process of $SiO_x$ takes place at about 900° C. and under a pressure of about $5\times10^{-4}$ millbar ($5\times10^{-5}$ kPa) [as disclosed in Dennler, Wertheimer, Houdayer, Raynaud, Ségui, "Growth Modes of $SiO_2$ Films on Polymeric Substrates", $45^{th}$ Annual Technical Conference Proceedings of the Society Vacuum Coaters (SVC) (2002), p. 465].

Preferably, when this method of evaporation is used, the surface of the porous substrate is pretreated with plasma to clean and activate the surface. Without wishing to be bound by theory, it is believed that the crystallographic structure of the inorganic layer is altered and the adhesion improved with plasma treatment, thereby increasing the protective effect of the inorganic layer on the metal layer. The pretreatment process uses a plasma generated by a water-cooled DC magnetron cathode as described in "Treatmag, a New Tool for Inline Plasma Pre-Treatment in Web Coaters for Packaging Applications" by G. Löbig, R. Ludwig, P. Seserko, and G. Steiniger, Leybold Systems GmbH, Germany.

A second evaporation process suitable for use in the invention involves evaporating the inorganic compound to be applied to the surface of the porous substrate by bombarding the inorganic material placed in a crucible (or a tray) with an electron beam from a high voltage electron beam gun in a vacuum chamber (evacuated to about $10^{-3}$ mbar ($10^{-4}$ kPa) or less). The electron beam gun consists of a beam generator and a beam guiding system. The beam can be generated by emitting electrons from the surface of a cathode and accelerating the electrons towards an anode. Magnetic fields are used to focus the beam and for guiding the beam to the crucible (or tray). There are different approaches for coating a wide web. One approach is to use an evaporator bank of multiple small EB-guns, similar to the arrangement of boats in standard evaporative metallizers [as disclosed in Matteuchi, "Electron Beam Evaporation and DC-Magnetron Sputtering in Roll Coating", $30^{th}$ Annual Technical Conference Proceedings of the SVC (1987), p. 91]. The second approach is to use a gun with a linear upscaled beam generator [as disclosed in Kuznetsov, "Electron Beam Evaporation Process in the Soviet Union", Annual Technical Conference Proceedings of the SVC (1978), p. 12]. The third approach is a scanning gun, where an electromagnetic coil system is used to move the beam across the crucible surface [Hoffmann, Kukla, Löbig, Ludwig, Seserko, Steiniger, $42^{nd}$ Annual Technical Conference Proceedings of the SVC (1999), p. 425].

Suitable inorganic materials for evaporation are in principle all new materials, which, after precipitating from the gas phase, with or without chemical reaction, form a layer that serves as a barrier for gas and moisture. Examples thereof are metal oxides such as silicon monoxide, silicon dioxide, other silicon oxides (referred to as $SiO_x$ with x ranging from 1 to less than 2, where x is the number of oxygen atoms for every silicon atom in a molecule of the compound), titanium oxide, zirconium oxide, aluminum oxide, and magnesium oxide. $SiO_x$ layers offer the advantage that they are flexible, chemically inert, and corrosion resistant with respect to water. The oxides may be mixed or doped. Further, these metals may be vaporized and, during the coating process, at least one reactive gas, e.g. oxygen, nitrogen, hydrogen, and/or acetylene introduced, with the result that the corresponding oxides, nitrides, carbides, or mixed components are formed. Of course, reactive gases may also be added if the material to be vaporized is already present as oxide, nitride, and/or carbide. The evaporation process can be reactive or not. Reactive evaporation is a process in which small traces of an active gas are added to the vacuum chamber; the evaporating material reacts chemically with the gas so that the compound is deposited on the substrate.

Chemical vapor deposition (CVD) can also be used in the process of the invention to apply the inorganic compound to the surface of the porous substrate. CVD is a chemical process that takes place in the vapor phase very near the substrate or on the substrate so that a reaction product is deposited onto the substrate. Specifically, plasma-enhanced chemical vapor deposition can be employed. Here, the reaction between the reactants is stimulated or activated by creating a plasma in the vapor phase.

There are well-known methods of creating plasmas for thin film deposition. In one, a pair of electrodes is placed in a low pressure gas, and either an AC or a DC voltage applied to create a glow discharge. A second approach uses a coil wound around a non-conducting tube containing the gas. Then, an AC field excites strong fields inside the tube and a discharge can be created. In a third method, a pair of electrodes can be placed, one on each side of a dielectric tube filled with gas, and again an AC voltage applied. This also produces a strong field inside the tube and a discharge can be created [as disclosed in the Bunshah, R. F. (ed.), Handbook of Deposition Technologies for Films and Coatings—Science, Technology and Applications (2nd Edition), 1994 William Andrew Publishing/Noyes].

Another process useful in the invention for the deposition of inorganic coatings is described in Casey, Smith, and Ellis, "Clear Barrier Coatings", $42^{nd}$ Annual Technical Conference Proceedings Of the SVC (1999) [p. 425]. The process is essentially a low pressure ($3 \times 10^{-2}$ to $8 \times 10^{-2}$ mbar ($3 \times 10^{-3}$ to $8 \times 10^{-3}$ kPa) plasma driven CVD process involving HMDSO (HexaMethyl DiSiloxane) vapour, oxygen, and helium. The plasma is generated by capacitively coupling medium frequency (e.g., 40 kHz) electric power between a drum electrode and a counter electrode. The polymer web to be coated runs on the drum and is coated by deposition from the adjacent magnetically enhanced plasma. Approximately 50% of the available silicon is incorporated on the deposited film. Some exhaust gases (e.g., $H_2O$, CO, $CO_2$, HC) are formed during this process.

Suitable materials to be used in plasma-enhanced CVD (PECVD) are organosilicon compounds, which can contain oxygen, nitrogen or sulfur atoms. Substances that would qualify for this purpose are primarily silanes, siloxanes, silazanes, and silathianes, preferably siloxanes. The utilization of hexamethyldisiloxane is especially preferred. It is also possible to use mixtures of such compounds, or their partially or completely fluorinated derivatives.

Yet another process for depositing the inorganic compound on the metal layer of the porous substrate is atmospheric pressure glow discharge (APG) or atmospheric pressure plasma enhanced chemical vapor deposition (AP-PECVD).

Patent WO 03/086031 A1 describes an atmospheric plasma assembly comprising two pairs of vertically arrayed, parallel spaced-apart planar electrodes providing two plasma zones and also an atomizer adapted to introduce an atomized liquid or solid monomer to react with plasma. An example for the preparation of a $SiO_x$ barrier is mentioned, wherein the substrate is first pretreated by helium cleaning/activation of substrate, followed by deposition of $SiO_x$ from a polydimethylsiloxane precursor in the first plasma region. Further helium plasma treatment is done to provide extra crosslinking of the $SiO_x$ layer and finally applying a coating utilizing a perfluorinated precursor. Any appropriate pre-treatments may be undertaken. The above-mentioned processes are enhanced by cleaning or activation of the surface to be coated.

FIG. 1 is a schematic diagram of an apparatus 10 suitable for coating of a metallized sheet layer with inorganic layers under vacuum by using the PVD (thermal evaporation) process. A vacuum chamber 11 is provided at the desired pressure. Suitable pressures are between $2 \times 10^{-4}$ to $2 \times 10^{-5}$ Torr ($2.66 \times 10^{-5}$ to $2.66 \times 10^{-6}$ kPa). Metallized moisture vapor permeable sheet 13 is fed from unwind roll 12 in the direction shown by the arrow, via guide rolls 16 and 17. After unwinding from roll 12, the sheet 13 passes through plasma treatment unit 4, where the surface of the sheet is exposed to plasma 5 to remove adsorbed oxygen, moisture, and any low molecular weight species on the surface of the sheet. The plasma treatment unit may be low frequency RF, high frequency RF, DC, or AC. Suitable plasma treatment methods are described in U.S. Pat. No. 6,066,826, WO 99/58757 and WO 99/59185. Sheet 13 is then fed via guide rolls 16 and 17 onto a cooled rotating drum 18, which rotates at a surface speed in the range of 1 to 1000 cm/second. Then the sheet passes above a tray 24 containing inorganic material 22. As an example, silicon oxide chunks can be used. Drum 18 can be cooled down to −20° C. to facilitate condensation of the inorganic material. The inorganic material is resistively heated and evaporated by the use of graphite heaters 20 that are located a few centimeters above the tray and which are spread out over the width of the machine. The evaporated or sublimated inorganic material 25 condenses on the surface of the sheet 13 and forms a layer which is thin enough that it does not substantially cover the pores of the sheet layer so that the composite sheet 19 has a moisture vapor permeability of at least about 80% of the uncoated starting sheet layer. The composite sheet 19 is picked from the surface of the drum 18 by guide roller 26 and taken up by wind-up roll 26.

Figure 2:
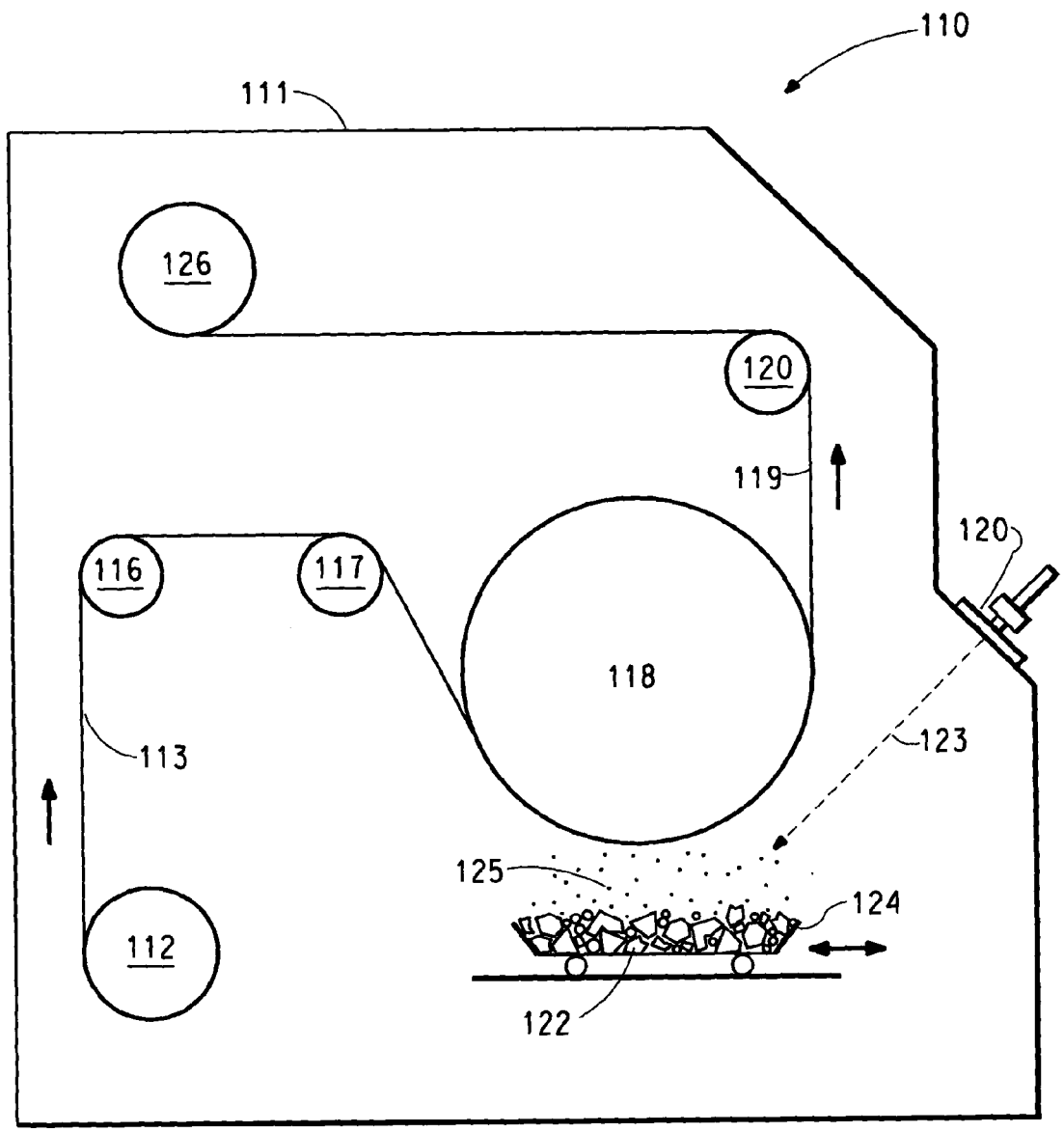
FIG. 2 is a schematic diagram of a different type of apparatus suitable for forming a composite sheet of the present invention.

FIG. 2 describes a different apparatus 100 suitable to heat and evaporate the inorganic material, which includes a vacuum chamber 111 that is provided at the desired pressure. Suitable pressures are between $2 \times 10^{-4}$ to $2 \times 10^{-5}$ Torr ($2.66 \times 10^{-5}$ to $2.66 \times 10^{-6}$ kPa). A metallized moisture vapor permeable sheet 113 is fed from unwind roll 112 in the direction shown by the arrow onto a cooled rotating drum 118 via guide rolls 116 and 117. The surface speed of drum 118 is generally in the range of 1 to 1000 cm/second. The sheet 113 passes above a tray 124 containing the inorganic material 122. As an example, pieces of silicon oxide can be used. Drum 118 can be cooled down to −20° C. to facilitate condensation of the inorganic material. A scanning electron beam gun 120 generates an electron beam 123, thereby evaporating inorganic material 122 contained in the tray 124. The evaporated or sublimated inorganic material 125 condenses on the surface of the sheet 113 and forms a layer which is thin enough that it does not substantially cover the pores of the sheet layer so that the composite sheet 119 has a moisture vapor permeability of at least about 80% of the uncoated starting sheet layer. The coated composite sheet 119 is picked from the surface of drum 118 by guide roller 120 and taken up by wind-up roll 126.

The metallized composite sheets of the present invention are especially suitable for use in roof and wall systems in building construction. The highly reflective metallized surface of the composite sheet provides a low emissivity surface that enhances the performance of the insulation and improves the energy efficiency of wall and roof systems, thus reducing fuel costs for the building owner. Additional benefits include minimization of condensation inside wall and roof structures in cold climates and shielding of the building from excessive heat during the summer months. The metallized composite sheets of the invention are also suitable as a layer for use in clothing, tents, sleeping bags, and other applications requiring good thermal barrier.

Test Methods

In the non-limiting examples that follow, the following test methods were employed to determine various reported characteristics and properties. ASTM refers to the American Society of Testing Materials. ISO refers to the International Standards Organization. TAPPI refers to Technical Association of Pulp and Paper Industry.

Resistance to Oxidation is determined by submitting the metallized side of the substrate to steam for 1.5 hours in a steam bath. The water temperature in the bath is 80° C. The amount of oxidation of the metallized layer is assessed visually. Unprotected metal turns white in color. Well-protected metal undergoes no significant change in visual appearance. The amount of oxidation is also assessed by measuring the optical density of the sample being exposed to steam. This property is measured using a transmission densitometer Model 361T from X-Rite, according to ANSI PH2.19-1986. The degree of metal oxidation is inversely related to the optical density. The optical density of the metallized sheet decreases as the metal transforms into metal oxide. The "Percentage of Retained Optical Density of the Metal Layer after Steam Exposure" is defined as: (optical density of metallized substrate after steam exposure minus optical density of non-metallized substrate) divided by (optical density of metallized substrate before steam exposure minus optical density of non-metallized substrate) times 100.

Emissivity is a measure of the heat absorbance and reflectance properties of a material. This property is measured using an Optosol sphere emissiometer Model 02K (available from Optosol GmbH, Ehebachstrasse 19, D-79379 Muellheim, Germany) consisting of an integrating sphere, a glowbar as a source of thermal radiation, and a detector which is sensitive for wavelengths in the range from 8 µm to 14 µm. The radiation from the glowbar is homogeneously distributed inside the integrating sphere that serves as a diffuse radiation source. The detector is installed at an angle of 10 degrees to the perpendicular of the sample surface. The radiation that is reflected by the sample is measured. The calibration of the measured signal is done by measuring two samples with known emittance values in the mentioned wavelength range: a sample with high emittance such as glass and a sample with low emittance or ideally with an emittance close to the emittance of the samples to be measured.

Thermal Resistance ($R_g$) is a measure of heat flow through a single reflective air space that has parallel bounding surfaces ("air cavity") and is calculated from the emissivity according to EN ISO 6946 and reported in units of $m^2$ K/W:

$R_g = 1/(h_c + h_r)$,

Where, $h_c$: heat transition coefficient (conduction, convection), $h_r$: heat transition coefficient (radiation)

$h_r = E h_{ro}$ $E = (1/\epsilon_1 + 1/\epsilon_2 - 1)^{-1}$ and $h_{ro} = 4 \sigma T_m^3$ E: Emissivity grade $h_{ro}$: Heat transition coefficient by radiation of a black body σ: Stefan-Boltzmann constant (5.67. $10^{-8}$ W $m^{-2}$ $K^{-4}$)

$T_m$: average thermodynamic temperature of the surface and its surroundings horizontal heat transfer: $h_c = 1.25$ W/$m^2$K or $h_c = 0.025/d$, if $> 1.25$ W/$m^2$K vertical upward heat transfer: $h_c = 1.95$ W/$m^2$K or $h_c = 0.025/d$, if $> 1.95$ W/$m^2$K d: thickness of air cavity $\epsilon_1, \epsilon_2$ = emissivities of the surfaces enclosing the air cavity In the Examples, $R_g$ is calculated for $T_m = 283°$ K, d=50 mm, $\epsilon_1$ = emissivity of the sheet, and $\epsilon_2 = 0.9$ (emissivity of a brick wall). A thermal conductivity for mineral wool of 0.038 W/mK was used to calculate the equivalent thickness of mineral wool.

Moisture Vapor Transmission Rate (MVTR) is a measure of the moisture vapor permeability of a material and was measured according to ASTM E398-83 using a Lyssy instrument. The sample is placed at 23° C. between a humid chamber with 100% relative humidity and a dry chamber with 15% relative humidity being thus exposed to a relative humidity gradient of 85%. MVTR is reported in g/$m^2$/24 hr.

Hydrostatic Head (or Hydrohead or HH) is a measure of the resistance of a sheet to the penetration of liquid water under a static load. The HH measurement uses DIN EN 20811:1992 and is reported in cm of water. A 100 $cm^2$ sample is mounted in a Textest AG Hydrostatic Head Tester. Water is pumped against one side of the sample with an increase of the hydrostatic load of 60 cm water/min until three points of leakage appear on the surface.

Basis weight (BW) was determined by ASTM D-3776, which is hereby incorporated by reference and reported in g/$m^2$.

EXAMPLES

In the following examples, unless otherwise specified, the metallized flexible porous substrate used was Tyvek® plexifilamentary film-fibril high density polyethylene sheet (style 1560 B) (available from E. I. du Pont de Nemours and Company, Wilmington, Del.) having a basis weight of about 60 g/$m^2$ and a thickness of about 180 µm, having a surface layer of aluminum applied using a TopMet® metallizer manufactured by Applied Films (Longmont, Colo.). The surface layer of aluminum had an average thickness of about 30 to about 40 nm.

Two different processes were used to deposit a SiOx coating onto the metallized Tyvek®, vacuum electron beam evaporation, and vacuum thermal evaporation. In both processes, SiOx was evaporated (sublimated) under vacuum of about $5 \times 10^{-4}$ to about $3 \times 10^{-5}$ mbar (about $5 \times 10^{-5}$ to about $3 \times 10^{-6}$ kPa) and deposited by condensation onto the metallized substrate passing over a cooling drum at a temperature of about −15 deg C.

Example 1-5 and Comparative Example 6

These examples demonstrate coated metallized sheets of the present invention made via vacuum electron beam evaporation deposition and compare the resulting sheets to uncoated metallized sheets and to an incumbent commercial metallized sheet suitable for use as house wrap.

SiOx (with x=1.1-1.2) was sublimated by an electron beam hitting solid SiOx chunks in a tray using a commercial Top-Beam® 1100 web coating system by Applied Films (Alzenau, Germany), and deposited onto 600 mm wide metallized Tyvek®. The power of the electron beam was maintained at about 41.9 kW. As a result of remaining oxygen in the vacuum chamber, the SiOx was further oxidized to an x of 1.4 to 1.7. Different thicknesses of the SiOx layer were obtained by varying the winding speed of the metallized substrate, i.e., the speed with which the substrate passes over the cooling drum. Four different speeds were used: 3 m/sec, 5 m/sec, 7.5 m/sec, and 10 m/sec.

No plasma pretreatment was applied to the metallized substrate. A plasma post-treatment removed residual electrical charges from the SiOx surface.

Resistance to oxidation, emissivity, thermal resistance, MVTR, and HH were measured. The results are given in Table 1. Examples 2-5 all exhibited good emissivity, MVTR, and HH. A winding speed of 3 m/sec (Example 2) resulted in a SiOx coating layer that provided protection of the aluminum layer from oxidation, maintained the MVTR of the substrate and gave a slight increase in emissivity of the sample, as compared to Comparative Example 1, which was not coated with SiOx. At this low speed, a relatively thick layer of SiOx was applied to the aluminum layer so that its resistance to oxidation was relatively high. However, Examples 3-5 provided somewhat less protection from oxidation at higher winding speeds, as can be seen by comparing the percentage of retained optical density of the metal layer after steam exposure to that of Comparative Example 1.

Comparative Example 6 is a commercial metallized Tyvek®, style 3460M, plexifilamentary film-fibril sheet (available from DuPont) having a basis weight of about 62 g/m$^2$ and a thickness of about 185 micrometers coated with an acrylate lacquer using a flexographic printing process with a thickness of 1 μm to 1.5 μm. Typical properties of this commercial coated metallized sheet are included in Table 1. As can be seen, the emissivity of the samples made according to the invention is about 50% lower than that of the incumbent lacquer-coated metallized sheet, and the MVTR of the samples made according to the invention is about 30% higher than that of the incumbent lacquer-coated sheet. This demonstrates that the coated samples of the invention provide significantly better thermal resistance (lower emissivity) than the incumbent lacquer-coated sheet without significantly impacting the sheet's other properties that are important in construction end uses such as house wrap and roof lining, and other end uses requiring thermal barrier such as garments, tents, and sleeping bags.

In addition to significantly higher MVTR compared to Comparative Ex. 6, the examples of the invention have approximately 42-53% lower emissivity. This further corresponds to an improvement in thermal resistance of the air cavity in combination with the examples of the invention of about 43-46% as opposed to Comparative Ex. 6. The present invention provides an improvement in insulating properties equivalent to 20-22 mm of mineral wool insulation, compared to 12 mm opposite Comparative Ex. 6

Comparative Example 7 and Examples 8-13

These examples demonstrate coated metallized sheets of the present invention made via vacuum thermal evaporation deposition and compare the resulting sheets to uncoated metallized sheets.

Graphite electrodes in a commercial TopMet® web coating system be Applied Films were placed above a tray filled with SiOx chunks (with x=1.1 to 1.2). The electrodes heated the SiOx to a temperature of 930° C. to 950° C., at which temperature the SiOx molecules sublimated. This happened at an electrical power of 9 kW on each electrode. The thickness of the SiOx layer was adjusted by varying the winding speed of the substrate. Winding speeds of 2 m/sec (Examples 8-9), 3 m/sec Examples 10-12) and 4 m/sec (Example 13) were used.

The TopMet® metallizer allows pretreatment of the substrate by a plasma generated by a DC magnetron cathode. The treatment level can be changed by varying the electrical current on the cathode and the flow and the nature of the treatment gas. The process was run with plasma pretreatment for the inventive examples. Plasma pretreatment currents from 5 A to 10 A with argon or a mixture of argon and oxygen as treatment gas were used. Pretreatment current was adjusted to winding speed. When the process was run without plasma pretreatment as in Comparative Example 7, insufficient protection of the aluminum layer from corrosion was provided, as detected by exposing the metal layer to steam and visually observing the resulting oxidation on the metal layer and testing for optical density.

Resistance to oxidation, emissivity, moisture vapor permeability (MVTR), and hydrostatic head (HH) were measured. The results are given in Table 2. Examples 8-12 all exhibited emissivity, MVTR, and HH that were substantially unchanged compared to the starting sheet layer (Comparative Example 7). Plasma pretreatment is preferred when a thermal evaporation deposition process is used.

TABLE 1

| Example | Winding Speed (m/sec) | Retained Optical Density (%) | Emissivity | MVTR (g/m$^2$/24 hr) | HH (cm water) | Thermal resistance [m$^2$K/W] | Equivalent thickness [mm] of mineral wool |
|---|---|---|---|---|---|---|---|
| 1 (Comparative) | No SiOx coating | 19 | 0.08 | 1300 | 220 | 0.603 | 23 |
| 2 | 3 | 87 | 0.096 | 1330 | 209 | 0.575 | 22 |
| 3 | 5 | 50 | 0.118 | 1340 | 214 | 0.541 | 20 |
| 4 | 7.5 | 44 | 0.106 | 1300 | 209 | 0.559 | 21 |
| 5 | 10 | 37 | 0.117 | 1510 | 214 | 0.542 | 20 |
| 6 (Comparative) |  | 100 | 0.205 | 1000 | 170 | 0.309 | 12 |

TABLE 2

| Example No. | Winding Speed (m/sec) | Pretreatment Cathode Current (A) | Pretreatment Gas | Gas Flow (cm³/min) | Retained Optical Density (%) | Emissivity | MVTR (g/m²/24 hr) | HH (cm water) |
|---|---|---|---|---|---|---|---|---|
| 7 (Comparative) | No SiOx coating | | | | 19 | 0.08 | 1300 | 220 |
| 8 | 2 | 5 | Ar | 500 | 87 | 0.110 | 1360 | 206 |
| 9 | 2 | 8 | Ar | 500 | 94 | 0.095 | 1360 | 214 |
| 10 | 3 | 7.5 | Ar | 500 | 87 | 0.101 | 1410 | 206 |
| 11 | 3 | 7.5 | Ar | 1000 | 81 | 0.086 | 1400 | 201 |
| 12 | 3 | 7.5 | Ar + O₂ | 500 + 1000 | 81 | 0.091 | 1430 | 196 |
| 13 | 4 | 10 | Ar + O₂ | 500 + 1000 | 75 | Not measured | Not measured | Not measured |

What is claimed is:

1. A moisture vapor permeable flexible multilayer composite, comprising a moisture vapor permeable sheet and a metal layer selected from the group consisting of aluminum, silver, copper, gold, tin, zinc, and their alloys adjacent a first outer surface of the moisture vapor permeable sheet and an outer coating layer of inorganic material selected from the group consisting of silicon oxides, titanium oxides, zirconium oxides, magnesium oxides, metal nitrides, and metal carbides deposited on the metal layer and wherein the metal layer has a percentage of retained optical density after steam exposure greater than about 25%.

2. The flexible multilayer composite of claim 1, wherein the percentage of retained optical density of the metal layer after steam exposure is greater than about 35%.

3. The flexible multilayer composite of claim 1, wherein the MVTR of the composite sheet is at least about 80% of the MVTR of the sheet layer measured prior to depositing the metal and coating layers.

4. The breathable flexible multilayer composite of claim 1, wherein emissivity of the multilayer composite is less than about 0.2.

5. The flexible multilayer composite of claim 1, wherein the moisture vapor permeable sheet is selected from the group consisting of nonwoven fabrics, woven fabrics, paper, microperforated films, microporous films, moisture vapor permeable monolithic films, and composites thereof.

6. The flexible multilayer composite of claim 1, wherein the moisture vapor permeable sheet is a nonwoven fabric selected from the group consisting of spunbond fabrics, spunbond-meltblown fabrics, spunbond-meltblown-spunbond fabrics, flash spun plexifilamentary sheets, and composites thereof.

7. The flexible multilayer composite of claim 1, wherein the moisture vapor permeable sheet is a plexifilamentary film-fibril sheet comprising polymer selected from the group consisting of polypropylene, polyethylene, polyester and polyamide.

8. The flexible multilayer composite of claim 1, wherein the metal layer comprises a metal such that the emissivity of the composite is less than about 0.2.

9. The flexible multilayer composite of claim 1, wherein the inorganic material is silicon oxide.

10. The flexible multilayer composite of claim 1, wherein the metal layer has a thickness between about 15 nanometers and about 200 nanometers and the coating layer of inorganic material has a thickness of between about 25 and about 500 nanometers.

11. The metallized composite sheet of claim 1, wherein the multi-layer coating substantially covers the outer surfaces of the porous sheet while leaving the pores substantially uncovered.

12. The flexible multilayer composite of claim 1, wherein the moisture vapor permeable sheet has a basis weight of between about 10 g/m² and about 100 g/m² and an MVTR of greater than about 1000 g/m²/24 hr.

13. The flexible multilayer composite of claim 1, wherein the moisture vapor permeable sheet has a basis weight of between about 140 g/m² and about 300 g/m² and an MVTR of greater than about 1000 g/m²/24 hr.

14. The flexible multilayer composite of claim 1, wherein the emissivity is less than about 0.15, the MVTR is greater than about 1000 g/m²/24 hr and the hydrostatic head is at least about 20 cm water.

15. The flexible multilayer composite of claim 9, wherein the silicon oxide comprises at least 1 and less than 2 atoms of oxygen for each atom of silicon.

16. The flexible multilayer composite of claim 1, wherein the coating layer of inorganic material has a thickness of between about 25 nm and about 500 nm.

17. The flexible multilayer composite of claim 16, wherein the coating layer of inorganic material has a thickness of between about 60 nm and about 300 nm.

18. The flexible multilayer composite of claim 1, associated with an air cavity, having a thermal resistance equivalent to at least 20 millimeters of mineral wool.

19. A metallized composite sheet, comprising: a porous flash spun plexifilamentary sheet layer having first and second outer surfaces and at least one multi-layer coating comprising: a metal coating layer having a thickness between about 15 nanometers and about 200 nanometers deposited on the first outer surface of the flash spun plexifilamentary sheet layer, said metal selected from the group consisting of aluminum, silver, copper, gold, tin, zinc, and their alloys; and an outer inorganic coating layer of silicon oxide having a thickness between about 25 nanometers and about 500 nanometers deposited on the metal layer; wherein the emissivity of the coated sheet is less than about 0.2 and the MVTR of the coated sheet is at least about 80% of that of the uncoated sheet.

20. A roof system in a building construction, comprising the metallized composite sheet of claim 1 or 19.

21. A wall system in a building construction, comprising the metallized composite sheet of claim 1 or 19.

22. An article of clothing, comprising the metallized composite sheet of claim 1 or 19.

23. A tent, comprising the metallized composite sheet of claim 1 or 19.

24. A sleeping bag, comprising the metallized composite sheet of claim 1 or 19.

* * * * *